(12) United States Patent
Lin

(10) Patent No.: US 7,551,527 B2
(45) Date of Patent: Jun. 23, 2009

(54) OFFSET CALIBRATION SYSTEM AND METHOD OF AUTOMATIC POWER CONTROL LOOP

(75) Inventor: Yung-Yu Lin, Hsin-Chu (TW)

(73) Assignee: MediaTek, Inc., Hsin-Chu (TW)

(*) Notice: Subject to any disclaimer, the term of this patent is extended or adjusted under 35 U.S.C. 154(b) by 794 days.

(21) Appl. No.: 10/984,791

(22) Filed: Nov. 10, 2004

(65) Prior Publication Data
US 2005/0116723 A1 Jun. 2, 2005

Related U.S. Application Data

(63) Continuation-in-part of application No. 10/277,730, filed on Oct. 23, 2002, now Pat. No. 6,836,126.

(30) Foreign Application Priority Data
Sep. 2, 2002 (TW) .............................. 91119916 A

(51) Int. Cl.
*G11B 7/00* (2006.01)
(52) U.S. Cl. ................................... 369/44.29
(58) Field of Classification Search ....................... None
See application file for complete search history.

(56) References Cited

U.S. PATENT DOCUMENTS 5,251,194 A * 10/1993 Yoshimoto et al. ........ 369/44.26
5,289,447 A * 2/1994 Kobayashi et al. ........ 369/44.28
5,559,772 A * 9/1996 Takeda ..................... 369/44.36
7,317,673 B2 * 1/2008 Yu ........................... 369/53.23

* cited by examiner

*Primary Examiner*—Joseph Feild
*Assistant Examiner*—Peter Vincent Agustin
(74) *Attorney, Agent, or Firm*—Patterson & Sheridan, LLP; Keith P. Taboada

(57) ABSTRACT

An offset calibration system of a control loop at least comprises an optical-to-electrical converter and an electrical-to-optical converter. The optical-to-electrical converter generates a pre-output signal and then transmits the pre-output signal to the electrical-to-optical converter to amplify. The offset calibration system comprises a comparator, an offset calibration module, and a determination circuit. The comparator compares the pre-output signal with a predetermined pre-reference signal to generate a pre-compared signal. The offset calibration module stores a predetermined and adjustable offset calibration value for adding to the pre-output signal. The determination circuit adjusts the offset calibration value based on the pre-compared signal, so the offset calibration value can be added to the pre-output signal dynamically to compensate and calibrate the offset of the pre-output signal caused by the optical-to-electrical converter to avoid the electrical-to-optical converter amplifying the offset of the pre-output signal again.

21 Claims, 8 Drawing Sheets

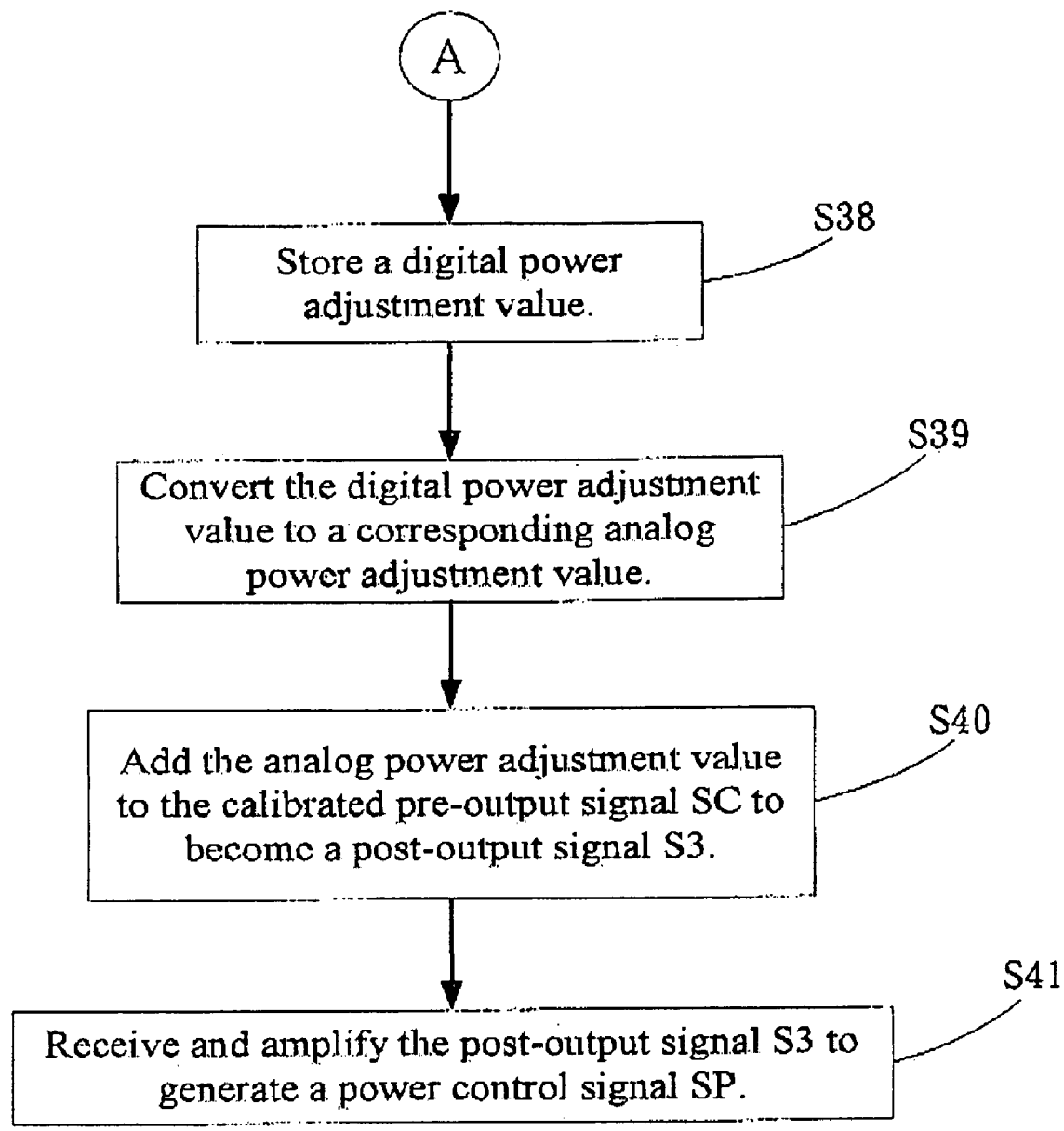
FIG. 3-Continue

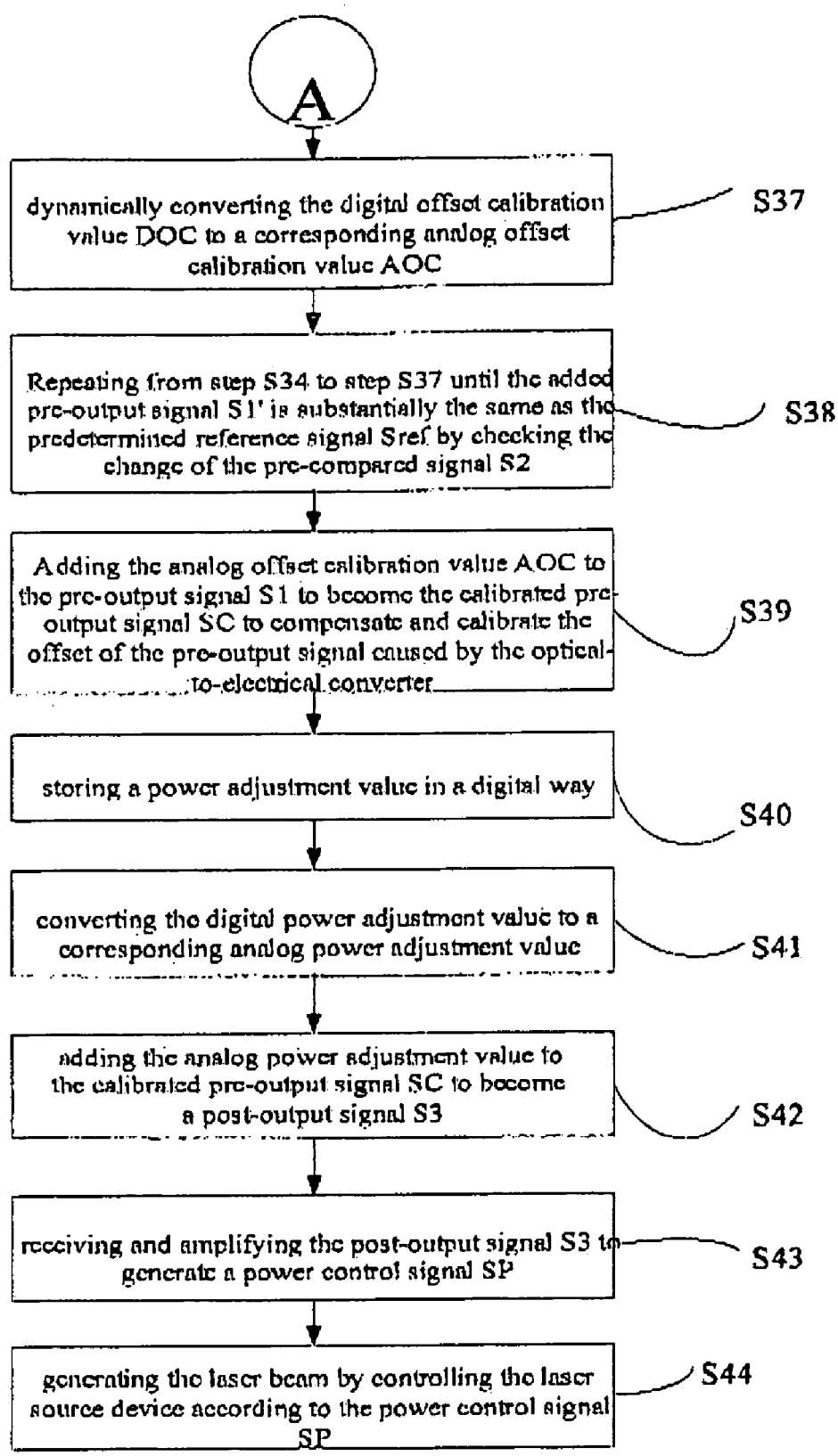
Fig. 6-Continue

OFFSET CALIBRATION SYSTEM AND METHOD OF AUTOMATIC POWER CONTROL LOOP

This application is a continuation in part of U.S. application Ser. No. 10/277,730 filed on Oct. 23, 2002, and now U.S. Pat. No. 6,836,126.

FIELD OF THE INVENTION

The present invention relates to an offset calibration system and method of an automatic power control loop for calibrating the offset generated by the automatic power control loop.

BACKGROUND OF THE INVENTION

When the pickup head of an optical information recording/reading apparatus writes and reads pits of a compact disk, an automatic power control loop is used to control and adjust the laser power of the laser diode within the pickup head. A pickup head comprises a laser diode, a laser diode driver and a laser power detector. The laser diode provides a laser source to read or write data on the compact disk. The laser power detector detects the laser power of the laser beam reflecting from the compact disk to output a corresponding laser power detection signal.

The pickup head uses different laser powers when it is writing or reading. The power in writing is higher than the power in reading. The laser powers are also different depending on writing/reading a land storage track or a groove storage track. It is important to control the power of the laser emitted by the laser diode. The laser diode is driven by the laser diode driver. Hence, controlling the laser diode driver can further control the laser power.

The automatic power control loop controls the laser diode driver to output a electric current to drive the laser diode for emitting a laser bean with an adequate laser power.

The laser power detection signal outputted by the laser power detector and the laser power of the detected laser beam are in inverse proportion. The laser power detection signal will be sampled and held by a sample/hold circuit of the automatic power control loop, and then transmitted to a pre-amplifier for amplifying to generate a pre-output signal. The pre-output signal is subtracted by a predetermined reference signal in an adder. If the result value does not equal to zero, the laser power of the laser beam still needs to be adjusted. A post-amplifier can adjust the pre-output signal and generate a power control signal. The post-amplifier transmits the power control signal to the laser diode driver for emitting an adequate laser power. In an ideal condition, when the laser diode doesn't emit the laser beam, the pre-output signal is the predetermined reference signal.

In general, the prior art control and calibration method for the laser power emitted by the laser diode can adjust the laser power very well. However, in the prior art, when the laser power detector generates a laser power detection signal with an offset, the automatic power control loop can't calibrate immediately. Through the amplifier, the offset is amplified and may be beyond the range that the adder can adjust. Therefore, a wrong power control signal is produced resulting in a wrong laser power wrong. Consequently, mistakes occur in writing/reading data of the compact.

SUMMARY OF THE INVENTION

It is therefore a primary objective of the present invention to provide an offset calibration system and method of an automatic power control loop for calibrating a laser power emitted from a laser diode so that the laser diode can emit accurate laser power.

The automatic power control loop of the present invention comprises a pre-amplifier circuit and a post-amplifier circuit. The pre-amplifier circuit generates a pre-output signal and then transmits the pre-output signal to the post-amplifier circuit for amplifying. The offset calibration system comprises a competitor, an offset calibration module and a determination circuit. The competitor compares the pre-output signal with a predetermined pre-reference signal to generate a pre-compared signal. The offset calibration module stores a predetermined and adjustable offset calibration value for adding to the pre-output signal. The determination circuit electrically connects to the competitor and the offset calibration module to adjust the offset calibration value stored in the offset calibration module based on the pre-compared signal generated by the competitor.

The determination circuit adjusts the offset calibration value dynamically based on the pre-compared signal, so the offset calibration value can be added to the pre-output signal dynamically to compensate and calibrate the offset of the pre-output signal caused by the pre-amplifier circuit. That will avoid the post-amplifier circuit amplifies the offset of the pre-output signal again.

The present invention calibrates the offset of an automatic power control loop by the offset calibration system. The offset of the pre-output signal can be compensated and calibrated immediately by the offset calibration system of the present invention to avoid that the post-amplifier circuit amplifies the offset of the pre-output signal again.

As another embodiment, the automatic power control loop of the present invention comprises an optical-to-electrical converter and an electrical-to-optical converter. The optical-to-electrical converter receives an optical input signal, generates a pre-output signal and then transmits the pre-output signal to the electrical-to-optical converter for amplifying the pre-output signal and then generating an optical output signal. The offset calibration system comprises a comparator, an offset calibration module and a determination circuit. The comparator compares the pre-output signal with a predetermined pre-reference signal to generate a pre-compared signal. The offset calibration module stores a predetermined and adjustable offset calibration value for adding to the pre-output signal. The determination circuit electrically connects to the comparator and the offset calibration module to adjust the offset calibration value stored in the offset calibration module based on the pre-compared signal generated by the comparator.

The determination circuit adjusts the offset calibration value dynamically based on the pre-compared signal, so the offset calibration value can be added to the pre-output signal dynamically to compensate and calibrate the offset of the pre-output signal caused by the optical-to-electrical converter. That will avoid the electrical-to-optical converter amplifies the offset of the pre-output signal again.

The present invention calibrates the offset of an automatic power control loop by the offset calibration system. The offset of the pre-output signal can be compensated and calibrated immediately by the offset calibration system of the present invention to avoid that the electrical-to-optical converter amplifies the offset of the pre-output signal again.

These and other objectives of the present invention will no doubt become obvious to those of ordinary skill in the art after the following detailed description of the preferred embodiment, which is illustrated in the various figures and drawings.

BRIEF DESCRIPTION OF THE APPENDED DRAWINGS

DETAILED DESCRIPTION OF THE INVENTION

Figure 1:
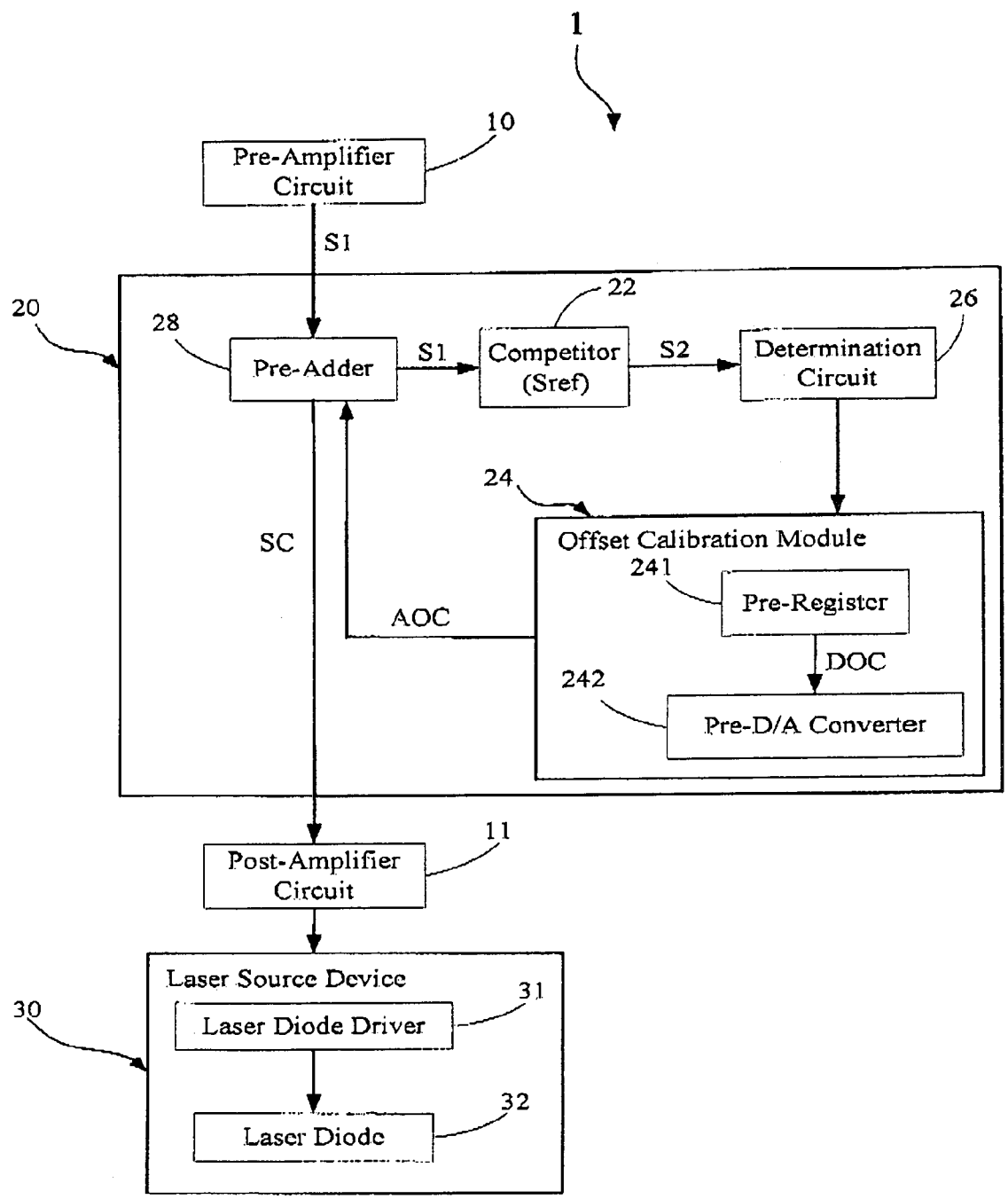
FIG. 1 is the block diagram according to the offset calibration system of the automatic power control system in the present invention.

Please refer to FIG. 1. FIG. 1 is a block diagram of an offset calibration system 20 of an automatic power control system 1 according to the present invention. The present invention is an offset calibration system 20 of a control loop 1. The control loop 1 comprises a pre-amplifier circuit 10 and a post-amplifier circuit 11. The pre-amplifier circuit 10 generates a pre-output signal S1 and then transmits the pre-output signal S1 to the post-amplifier circuit 11 to amplify. The control loop 1 is an automatic power control loop to control a laser source device 30.

The laser source device 30 comprises a laser diode 32 and a laser diode driver 31. The automatic power control loop 1 controls the laser diode driver 31 to output a driving electric current to drive a compact disk system (not show in FIG. 1) with the laser beam when the compact disk system reads or writes a compact disk. The compact disk system comprises a pickup head which comprises a laser power detector to detect a laser power of the laser beam reflecting from the compact disk, and to ouput a corresponding laser power detection signal. The laser power detection signal and the detected laser power of the laser beam are in inverse proportion.

The offset calibration system 20 of the present invention comprises a competitor 22, an offset calibration module 24, a determination circuit 26, and a pre-adder 28. A competitor 22 compares the pre-output signal S1 with a predetermined pre-reference signal Sref to generate a pre-compared signal S2. The offset calibration module 24 stores a predetermined and adjustable analog offset calibration value AOC for adding to the pre-output signal S1. The determination circuit 26 electrically connects to the competitor 22 and the offset calibration module 24 to adjust the analog offset calibration value AOC stored in the offset calibration module 24 based on the pre-compared signal S2 generated by the competitor 22. The pre-adder 28 makes the analog offset calibration value AOC add to the pre-output signal S1 to become a calibrated pre-output signal SC, and then transmits the calibrated pre-output signal SC to the post-amplifier circuit 11.

The determination circuit 26 adjusts the analog offset calibration value AOC dynamically based on the pre-compared signal S2, so the analog offset calibration value AOC can be added to the pre-output signal S1 dynamically to compensate and calibrate the offset of the pre-output signal S1 caused by the pre-amplifier circuit 10 to avoid that the post-amplifier circuit 11 amplifies the offset of the pre-output signal S1 again.

The offset calibration module 24 comprises a pre-register 241 and a pre-D/A converter 242. The pre-register 241 stores a digital offset calibration value DOC. The pre-D/A converter 242 converts the digital offset calibration value DOC to a corresponding analog offset calibration value AOC. The analog offset calibration value AOC will be sent to the pre-adder 28, and then added to the pre-output signal S1.

In an ideal situation, when the laser diode 32 doesn't emit the laser beam, the pre-output signal S1 generated by the pre-amplifier circuit 10 is the predetermined pre-reference signal Sref. Only when the laser diode 32 doesn't emit the laser beam, the determination circuit 26 will adjust the offset calibration value based on the pre-compared signal S2 to make the pre-adder 28 add the analog-offset calibration value AOC to the pre-output signal S1 for compensating and calibrating.

Figure 2:
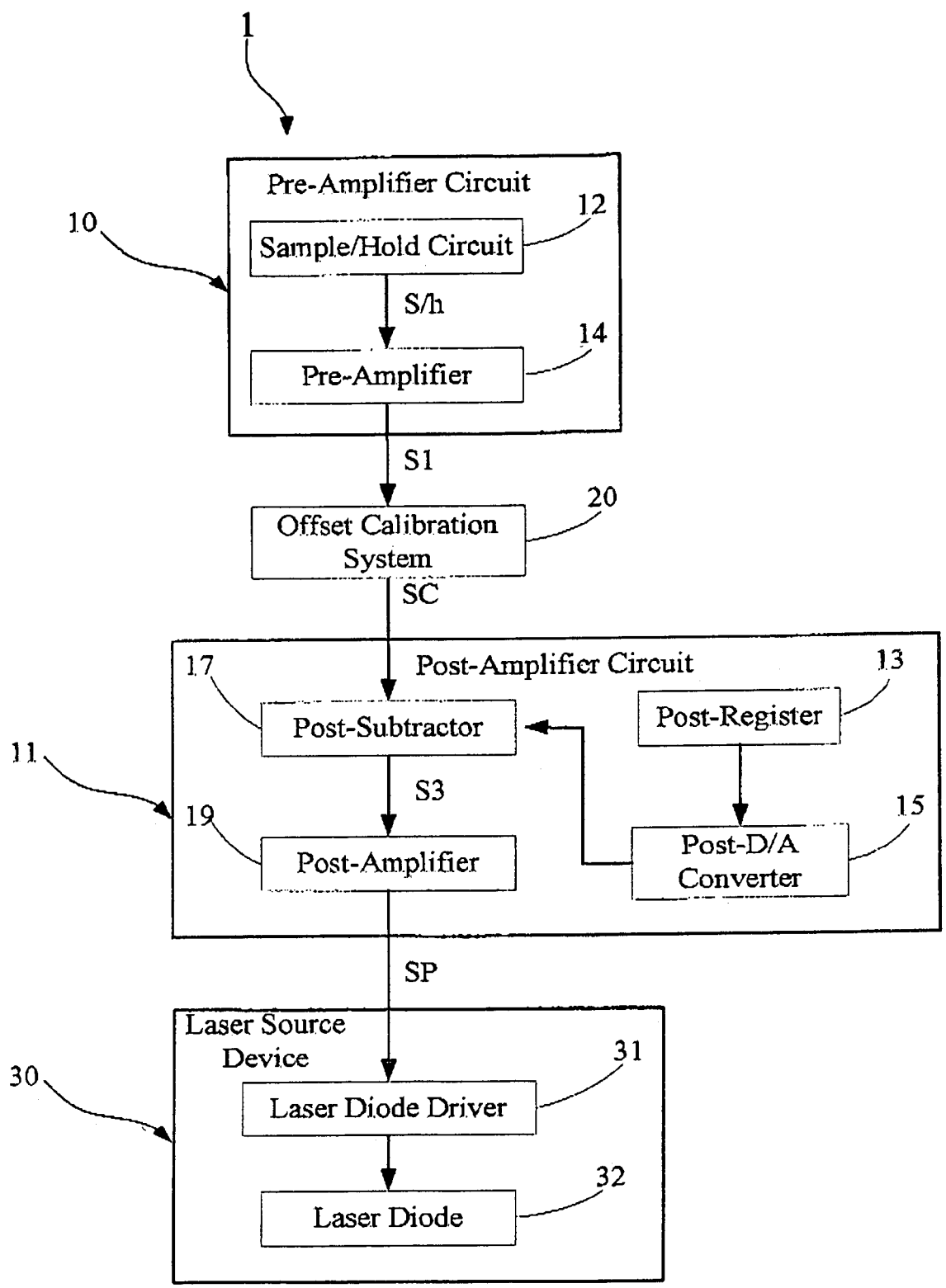
FIG. 2 is the block diagram of the pre-amplifier circuit and the post-amplifier circuit according to FIG. 1.

Please refer to FIG. 2. FIG. 2 is a block diagram of the pre-amplifier circuit 10 and the post-amplifier circuit 11 shown in FIG. 1. The pre-amplifier 10 comprises a sample/hold circuit 12 and a pre-amplifier 14. The sample/hold circuit 12 samples and holds the laser power detection signal according to a control signal, and outputs a sample/hold signal S/h. The pre-amplifier 14 receives and amplifies the sample/hold signal S/h outputted from the sample/hold circuit 12 to generate the pre-output signal S1. The pre-output signal S1 then is inputted to the offset calibration system 20 of the present invention for calibrating the offset.

As shown in FIG. 2, the calibrated pre-output signal SC is inputted to the post-amplifier circuit 11. The post-amplifier circuit 11 provides a power control signal SP to control a laser diode driver 31 of the laser source device 30. The post-amplifier circuit 11, comprises a post-register 13, a post-D/A converter 15, a post-subtractor 17, and a post-amplifier 19. The post-register 13 stores a digital power adjustment value. The post-register 13 comprises a plurality of storage units to store the digital power adjustment value, and the number of storage units in the post-register 13 determines the range of the digital power adjustment value. The determination circuit 26 adjusts the offset calibration value according to the pre-compared signal S2 to make the analog offset calibration value AOC added to the pre-output signal S1 to avoid the pre-output signal S1 being beyond the range of the power adjustment value in the post-register 13.

The post-D/A converter 15 converts the digital power adjustment value to a corresponding analog power adjustment value. The post-subtractor 17 adds the analog power adjustment value to the calibrated pre-output signal SC to become a post-output signal S3. The post-amplifier 19 receives and amplifies the signal from the post-subtractor 17 to generate the power control signal SP. The power control signal SP can control the laser diode driver 31, and further control the laser power of the laser beam emitted from the laser diode 32.

Figure 3:
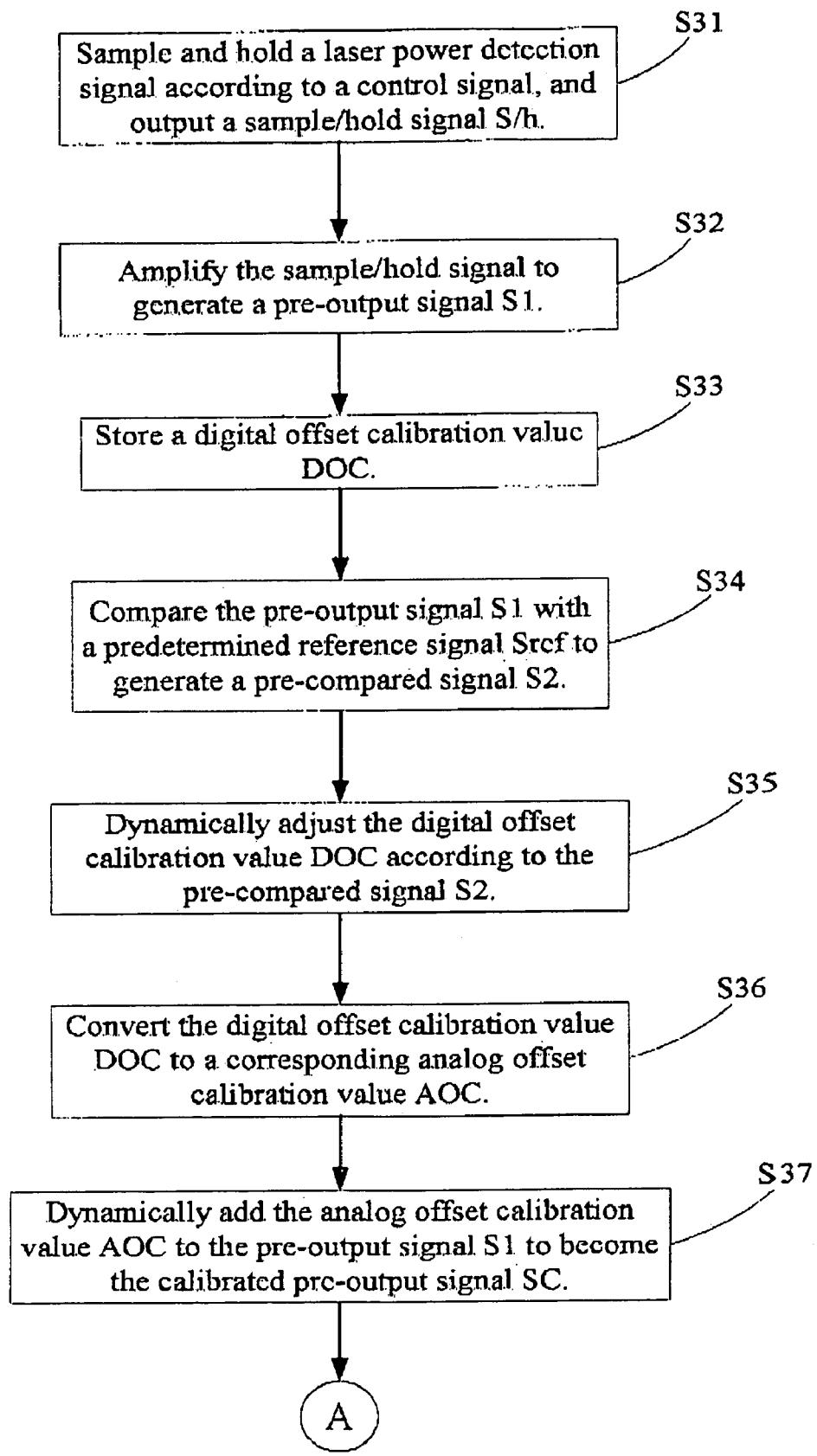
FIG. 3 is the flow chart of the automatic power control loop and the offset calibration system of the present invention according to FIG. 1 and FIG. 2.

Please refer to FIG. 3. FIG. 3 is a flow chart of the automatic power control loop 1 and the offset calibration system 20 of the present invention according to FIG. 1 and FIG. 2. The method comprises the following steps:

Step S31: sampling and holding a laser power detection signal according to a control signal, and outputting a sample/hold signal S/h;

Step S32: amplifying the sample/hold signal S/h to generate a pre-output signal S1;

Step S33: storing a digital offset calibration value DOC;

Step S34: comparing the pre-output signal S1 with a predetermined reference signal Sref to generate a pre-compared signal S2;

Step S35: dynamically adjusting the digital offset calibration value DOC according to the pre-compared signal S2;

Step S36: converting the digital offset calibration value DOC to a corresponding analog offset calibration value AOC, Step S37: dynamically adding the analog offset calibration value AOC to the pre-output signal S1 to become the calibrated pre-output signal SC to compensate and calibrate the offset of the pre-output signal caused by the pre-amplifier circuit to avoid the post-amplifier circuit amplifying the offset of the pre-output signal again, Step S38: storing a power adjustment value in a digital way;

Step S39: converting the digital, power adjustment value to a corresponding analog power adjustment value;

Step S40: adding the analog power adjustment value to the calibrated pre-output signal SC to become a post-output signal S3;

Step S41: receiving and amplifying the post-output signal S3 to generate a power control signal SP.

Figure 4:
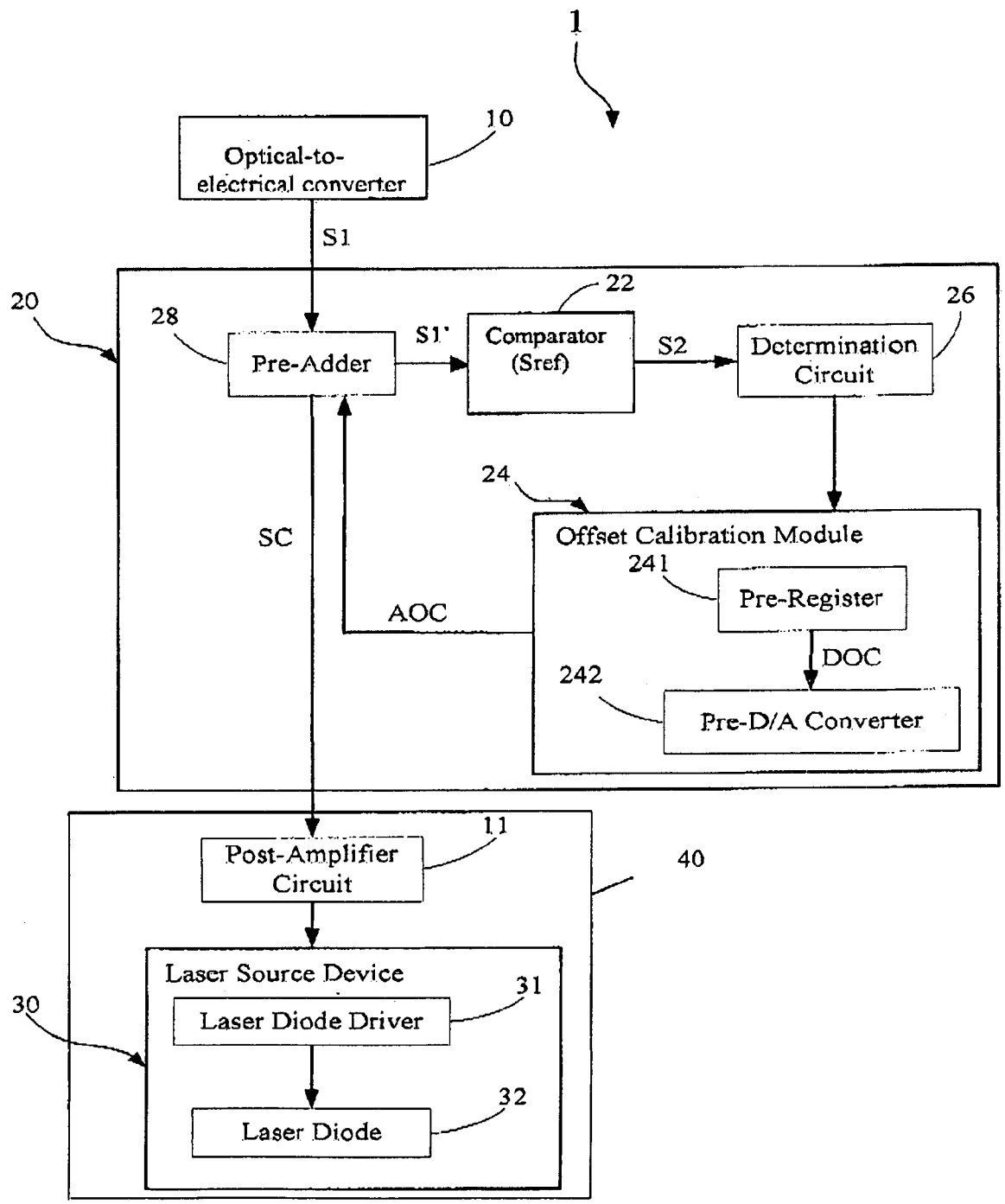
FIG. 4 is the block diagram of the second embodiment of this invention according to the offset calibration system of the automatic power control system in the present invention.

The following is the second embodiment of this invention. Please refer to FIG. 4. FIG. 4 is a block diagram of an offset calibration system 20 of an automatic power control system 1 according to second embodiment of the present invention. The present invention is an offset calibration system 20 of a control loop 1. As an embodiment, the control loop 1 comprises an optical-to-electrical converter 10 and an electrical-to-optical converter 40. The optical-to-electrical converter 10 generates a pre-output signal S1 and then transmits the pre-output signal S1 to the electrical-to-optical converter 40. The control loop 1 comprises a laser source device 30 and outputs a laser beam The laser source device 30 comprises a laser diode 32 and a laser diode driver 31. The automatic power control loop 1 outputs the laser beam to the compact disk system, and the driving electric current generated by the laser diode driver 31 controls the amplitude of the laser beam. The compact disk system comprises a pickup head which comprises a laser power detector to detect a laser power of the laser beam and to output a corresponding laser power detection signal.

The offset calibration system 20 of the present invention comprises a comparator 22, an offset calibration module 24, a determination circuit 26, and a pre-adder 28. The comparator 22 compares an added pre-output signal S1' with a predetermined pre-reference signal Sref to generate a pre-compared signal S2. The offset calibration module 24 stores a predetermined and adjustable analog offset calibration value AOC for adding to a pre-output signal S1. The determination circuit 26 electrically connects to the comparator 22 and the offset calibration module 24 to adjust the analog offset calibration value AOC stored in the offset calibration module 24 based on the pre-compared signal S2 generated by the comparator 22. The pre-adder 28 makes the analog offset calibration value AOC added to the pre-output signal S1 to become a calibrated pre-output signal SC, and then transmits the calibrated pre-output signal SC to the electrical-to-optical converter 40.

The determination circuit 26 adjusts the analog offset calibration value AOC dynamically based on the pre-compared signal S2, so the analog offset calibration value AOC can be added to the pre-output signal S1 dynamnically to compensate and calibrate the offset of the pre-output signal S1 caused by the optical-to-electrical converter 10 to avoid that the electrical-to-optical converter 11 amplifies the offset of the pre-output signal S1 again.

The offset calibration module 24 comprises a pre-register 241 and a pre-D/A converter 242. The pre-register 241 stores a digital offset calibration value DOC. The pre-D/A converter 242 converts the digital offset calibration value DOC to a corresponding analog offset calibration value AOC. The analog offset calibration value AOC will be sent to the pre-adder 28.

In an ideal situation, when the laser diode 32 doesn't emit the laser beam, the pre-output signal S1 generated by the optical-to-electrical converter 10 is the predetermined pre-reference signal Sref. Only when the laser diode 32 doesn't emit the laser beam, the determination circuit 26 will adjust the offset calibration value based on the pre-compared signal S2 to modify the analog offset calibration value AOC. When the laser diode 32 doesn't emit the laser beam, the analog offset calibration value AOC is initially set as zero and the initial added pre-output signal S1' the same as pre-output signal S1. If the added pre-output signal S1' is lower than the predetermined pre-reference signal Sref, the pre-compared signal S2 will be set as zero. Accordingly, the determination circuit 26 will decrease the analog offset calibration value AOC to reduce the added pre-output signal S1'. If the added pre-output signal S1' is still lower than the predetermined pre-reference signal Srcf, the pre-compared signal S2 still will be zero and the determination circuit 26 will decrease the analog offset calibration value AOC to reduce the added pre-output signal S1' again until the added pre-output signal S1' is higher than the predetermined pre-reference signal Sref. At that moment, the determination, circuit 26 stop working and the analog offset calibration value AOC is fixed.

Figure 5:
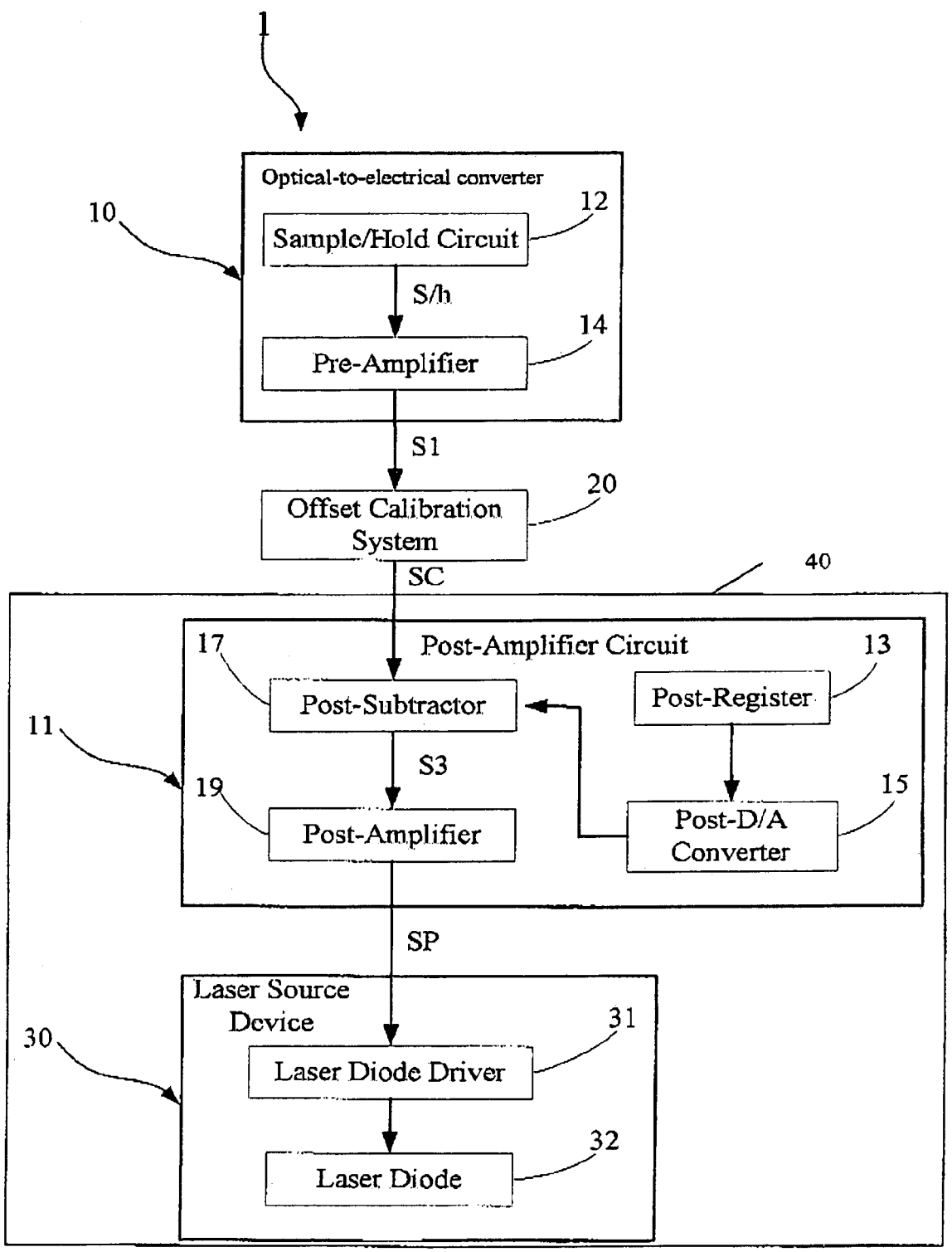
FIG. 5 is the block diagram of the optical-to-electrical converter and the electrical-to-optical converter according to FIG. 4.

Please refer to FIG. 5. FIG. 5 is a block diagram of the optical-to-electrical converter 10 and the electrical-to-optical converter 40 shown in FIG. 4. The pre-amplifier 10 comprises a sample/hold circuit 12 and a pre-amplifier 14. The sample/hold circuit 12 samples and holds the laser power detection signal according to a control signal, and outputs a sample/hold signal S/h. The pre-amplifier 14 receives and amplifies the sample/hold signal S/h outputted from the sample/hold circuit 12 to generate the pre-output signal S1. The pre-output signal S1 then is inputted to the offset calibration system 20 of the present invention for calibrating the offset.

As shown in FIG. 5, the calibrated pre-output signal SC is inputted to the electrical-to-optical converter 40. The electrical-to-optical converter 40 comprises a post-amplifier circuit 11 and a laser source device 30. The post amplifier circuit 11 provides a power control signal SP to control a laser diode driver 31 of the laser source device 30. The post-amplifier circuit 11 comprises a post-register 13, a post-D/A converter 15, a post-subtractor 17, and a post-amplifier 19. The post-register 13 stores a digital power adjustment value. The post-register 13 comprises a plurality of storage units to store the digital power adjustment value, and the number of storage units in the post-register 13 determines the range of the digital power adjustment value. The determination circuit 26 adjusts the offset calibration value according to the pre-compared signal S2 to make the analog offset calibration value AOC added to the pre-output signal S1 to avoid the pre-output signal S1 being beyond the range of the power adjustment value in the post-register 13.

The post-D/A converter 15 converts the digital power adjustment value to a corresponding analog power adjustment value. The post-subtractor 17 adds the analog power adjustment value to the calibrated pre-output signal SC to become a post-output signal S3. The post-amplifier 19 receives and amplifies the signal from the post-subtractor 17 to generate the power control signal SP. The power control signal SP can control the laser diode driver 31, and further control the laser power of the laser beam emitted from the laser diode 32.

Figure 6:
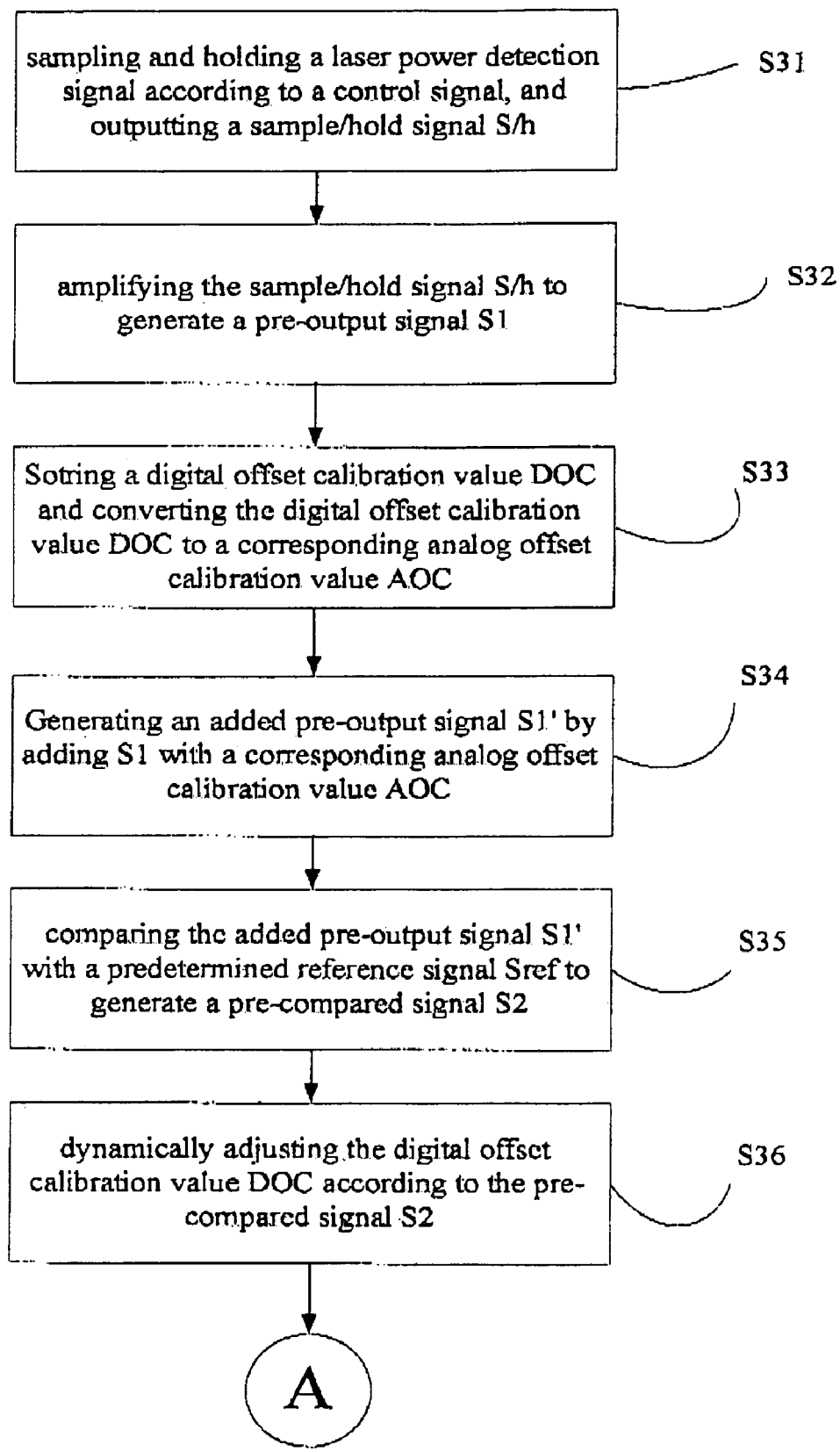
FIG. 6 is the flow chart of the automatic power control loop and the offset calibration system of the present invention according to FIG. 4 and FIG. 5.

Please refer to FIG. 6. FIG. 6 is a flow chart of the automatic power control loop 1 and the offset calibration system 20 of the present invention according to FIG. 4 and FIG. 5. The method comprises the following steps:

Step S31: sampling and holding a laser power detection signal according to a control signal, and outputting a sample/hold signal S/h;

Step S32: amplifying the sample/hold signal S/h to generate a pre-output signal S1;

Step S33: Sotring a digital offset calibration value DOC and converting the digital offset calibration value DOC to a corresponding analog offset calibration value AOC;

Step S34: Generating an added pre-output signal S1' by adding S1 with a corresponding analog offset calibration value AOC;

Step S35: comparing the added pre-output signal S1' with a predetermined reference signal Sref to generate a pre-compared signal S2;

Step S36: dynamically adjusting the digital offset calibration value DOC according to the pre-compared signal S2;

Step S37: dynamically converting the digital offset calibration value DOC to a corresponding analog offset calibration value AOC;

Step S38: Repeating from step S34 to step S37 until the added pre-output signal S1' is substantially the same as the predetermined reference signal Sref by checking the change of the pre-compared signal S2.

Step S39: Adding the analog offset calibration value AOC to the pre-output signal S1 to become the calibrated pre-output signal SC to compensate and calibrate the offset of the pre-output signal caused by the optical-to-electrical converter;

Step S40: storing a power adjustment value in a digital way,

Step S41: converting the digital power adjustment value to a corresponding analog power adjustment value;

Step 542: adding the analog power adjustment value to the calibrated pre-output signal SC to become a post-output signal S3;

Step S43; receiving and amplifying the post-output signal S3 to generate a power control signal SP.

Step S44: generating the laser beam by controlling the laser source device according to the power control signal SP.

The present invention utilizes an offset calibration system to compare and calibrate the pre-output signal generated by the pre-amplifier circuit. The invention makes the offset of the pre-output signal calibrated by the offset calibration system before outputted into the post-amplifier circuit to avoid the pre-output signal with offset to be transmitted to the post-amplifier circuit, so to avoid the offset being beyond the range of the power adjustment value. After amplifying, the offset will become the larger power control signal. However, the offset of the pre-output signal has been calibrated by the offset calibration system of the present invention, so that mistakes will not occur when writing/reading data of the compact disk system. This appears the advantage and the utility of the offset calibration system in the present invention. Also, the present invention utilizes an offset calibration system to compare and calibrate the pre-output signal generated by the optical-to-electrical converter. The invention makes the offset of the pre-output signal calibrated by the offset calibration system before outputted into the electrical-to-optical converter to avoid the pre-output signal with offset to be transmitted to the electrical-to-optical converter, so to avoid the offset being beyond the range of the power adjustment value. After amplifying, the offset will become the larger power control signal. However, the offset of the pre-output signal has been calibrated by the offset calibration system of the present invention, so that mistakes will not occur when writing/reading data of the compact disk system. This appears the advantage and the utility of the offset calibration system in the present invention.

The description of the above-mentioned preferred embodiments provides a better understanding on the strengths and spirits of this present invention, not to limit the domain of the invention. Moreover, it aims to include various modification and arrangement parallel in form into the domain of the patent applied by this present invention. Due to the above mention, the domain of the patent applied by the invention should be explained in a macro view to cover all kinds of possible modification and arrangement of equal form.

What is claimed is:

1. An offset calibration system of a control loop which at least comprises an optical-to-electrical converter, which converts an optical signal to an electrical signal, and an electrical-to-optical converter, which converts an electrical signal to an optical signal, said optical-to-electrical converter generating a pre-output signal and then transmitting said pre-output signal to the electrical-to-optical converter to amplify, said offset calibration system comprising:

a comparator for comparing said pre-output signal with a predetermined pre-reference signal to generate a pre-compared signal;

an offset calibration module for storing an offset calibration value, which is predetermined and adjustable, for adding to said pre-output signal; and a determination circuit for electrically connecting to said comparator and said offset calibration module, and adjusting said offset calibration value stored in said offset calibration module based on said pre-compared signal generated by said comparator;

wherein said determination circuit adjusts said offset calibration value dynamically based on said pre-compared signal, so said offset calibration value can be added to the pre-output signal dynamically to compensate and calibrate the offset of said pre-output signal caused by said optical-to-electrical converter.

2. The offset calibration system according to claim 1, wherein said electrical-to-optical converter comprises:

a post-register for storing a digital power adjustment value;

a post-D/A converter for converting said digital power adjustment value to a corresponding analog power adjustment value;

a post-subtractor for adding said analog power adjustment value to said pre-output signal;

a post-amplifier for receiving and amplifying the signal from said post-subtractor to generate a power control signal; and a laser source device.

3. The offset calibration system according to claim 2, wherein said laser source device comprises a laser diode and a laser diode driver, and said laser diode driver for outputting a driving electric current to drive said laser diode which emits a corresponding laser beam.

4. The offset calibration system according to claim 3, wherein said laser diode provides a compact disk system with said laser beam when said compact disk system reads or writes a compact disk, said compact disk system comprising a pickup head which comprises a laser power detector to detect a laser power of said laser beam, and output a corresponding laser power detection signal.

5. The offset calibration system according to claim 4, wherein said optical-to-electrical converter comprises:
 a sample/hold circuit for sampling and holding said laser power detection signal according to a control signal; and
 a pre-amplifier for receiving and amplifying the signal outputted from said sample/hold circuit to generate said pre-output signal.

6. The offset calibration system according to claim 3, wherein in an ideal condition, when said laser diode doesn't emit said laser beam, said pre-output signal generated by said optical-to-electrical converter is said predetermined pre-reference signal.

7. The offset calibration system according to claim 6, wherein when said laser diode doesn't emit said laser beam, said determination circuit will adjust said offset calibration value based on said pre-compared signal to make said offset calibration value added to said pre-output signal for compensating and calibrating.

8. The offset calibration system according to claim 1, wherein said offset calibration system further comprises a pre-adder to make said offset calibration value added to said pre-output signal.

9. The offset calibration system according to claim 8, wherein said offset calibration module comprises:
 a pre-register for storing said offset calibration value digitally; and
 a pre-D/A converter for converting said digital offset calibration value to a corresponding analog offset calibration value to be sent to said pre-adder.

10. The offset calibration system according to claim 2, wherein said post-register comprises a plurality of storage units to store said digital power adjustment value, and the number of storage units in said post-register determines the range of said digital power adjustment value.

11. The offset calibration system according to claim 10, wherein said determination circuit adjusts said offset calibration value according to said pre-compared signal to make said offset calibration value add to said pre-output signal to avoid said pre-output signal being beyond the range of said power adjustment value in said post-register.

12. An offset calibration method of a control loop which at least comprises an optical-to-electrical converter circuit, which converts an optical signal to an electrical signal, and an electrical-to-optical converter circuit, which converts an electrical signal to an optical signal, said optical-to-electrical converter circuit generating a pre-output signal and then transmitting said pre-output signal to the electrical-to-optical converter circuit to amplify, said offset calibration method comprising:
 comparing said pre-output signal with a predetermined pre-reference signal to generate a pre-compared signal;
 dynamically adjusting a pre-stored offset calibration value according to said pre-compared signal; and
 dynamically adding said offset calibration value to said pre-output signal to compensate and calibrate the offset of said pre-output signal caused by said optical-to-electrical converter circuit.

13. The offset calibration method according to claim 12, wherein said optical-to-electrical converter circuit provides a laser beam by the following steps:
 storing a digital power adjustment value;
 converting said digital power adjustment value to a corresponding analog power adjustment value;
 adding said analog power adjustment value to said pre-output signal;
 receiving and amplifying said pre-output signal added to said analog power adjustment value to generate a power control signal; and
 outputting said laser beam by controlling a laser source device according to said power control signal.

14. The offset calibration method according to claim 13, wherein said laser source device comprises a laser diode and a laser diode driver, and said laser diode driver for outputting a driving electric current to drive said laser diode which emits a corresponding laser beam.

15. The offset calibration method according to claim 14, wherein said laser diode provides a compact disk system with said laser beam when said compact disk system reads and writes a compact disk, said compact disk system comprising a pickup head which comprises a laser power detector to detect a laser power of said laser beam, and output a corresponding laser power detection signal.

16. The offset calibration method according to claim 15, wherein said method further comprises:
 sampling and holding said laser power detection signal according to a control signal using a sample/hold circuit; and
 amplifying said laser power detection signal outputted from said sample/hold circuit to generate said pre-output signal.

17. The offset calibration method according to claim 15, wherein in an ideal condition, when said laser diode doesn't emit said laser beam, said pre-output signal generated by said optical-to-electrical converter is said predetermined pre-reference signal.

18. The offset calibration method according to claim 17, wherein when said laser diode doesn't emit said laser beam, said offset calibration value is adjusted based on said pre-compared signal to make said offset calibration value added to said pre-output signal for compensating and calibrating.

19. The offset calibration method according to claim 12, wherein the offset calibration method further comprises:
 storing said offset calibration value digitally; and
 converting said digital offset calibration value to a corresponding analog offset calibration value to be added to said pre-output signal.

20. The offset calibration method according to claim 13, wherein said electrical-to-optical converter comprises a post-register which has a plurality of storage units to store said digital power adjustment value, and the number of said storage units in said post-register determines the range of said digital power adjustment value.

21. The offset calibration method according to claim 20, wherein said offset calibration value is adjusted according to said pre-compared signal and added to said pre-output signal to avoid said pre-output signal being beyond the range of said digital power adjustment value in said post-register.

* * * * *